United States Patent
Sasaki et al.

[11] Patent Number: 6,163,496
[45] Date of Patent: Dec. 19, 2000

[54] SEMICONDUCTOR MEMORY DEVICE HAVING A COMMON COLUMN DECODER SHARED BY PLURALITY OF BANKS

[75] Inventors: Toshiro Sasaki; Yuichi Matsushita, both of Miyazaki, Japan

[73] Assignee: Oki Electric Industry Co., Ltd., Tokyo, Japan

[21] Appl. No.: 09/418,040

[22] Filed: Oct. 14, 1999

[30] Foreign Application Priority Data

Dec. 25, 1998 [JP] Japan .................................. 10-370975

[51] Int. Cl.⁷ ...................................................... G11C 8/00
[52] U.S. Cl. ................................. 365/230.03; 365/230.06
[58] Field of Search ........................ 365/230.06, 230.03, 365/231, 191, 203

[56] References Cited

U.S. PATENT DOCUMENTS 5,687,132 11/1997 Rao .................................... 365/230.03
5,953,257 9/1999 Inoue et al. ......................... 365/189.01
6,016,280 1/2000 Maesako et al. ....................... 365/226

*Primary Examiner*—David Nelms
*Assistant Examiner*—Thong Le
*Attorney, Agent, or Firm*—Jones Volentine, L.L.C.

[57] ABSTRACT

A column switching circuit that connects a bit line pair and sub-data buses is constituted of first through fourth N transistors. The first and third N transistors are connected in series to a first bit line of the bit line pair whereas the second and fourth N transistors are connected in series to the second bit line of the bit line pair. The gate of the first N transistor and the gate of the second N transistor are connected to commonly receive a column switch selection signal. The gate of the third N transistor and the gate of the fourth N transistor are commonly connected to a column line. By adopting this structure, the generation of a through current is prevented from occurring between the bit line pair and the sub-data buses to result in a reduction in power consumption and miniaturization of the chip is achieved.

17 Claims, 6 Drawing Sheets

SEMICONDUCTOR MEMORY DEVICE HAVING A COMMON COLUMN DECODER SHARED BY PLURALITY OF BANKS

BACKGROUND OF THE INVENTION

1. Field of the Invention

The present invention relates to a semiconductor memory and, in particular, it relates to a semiconductor memory provided with a plurality of banks.

2. Description of the Related Art

The use of DRAM provided with a plurality of banks (hereafter referred to as "multibank DRAM") as semiconductor memory that enables high speed access to memory cells has become increasingly common in recent years. Normally, in a multibank DRAM, a bank selected by a word line (hereafter referred to as a "row-active bank") and a bank selected by a column line (hereafter referred to as a "column-active bank") do not correspond with each other on a one-to-one basis. Namely, in a multibank DRAM in which the column line is shared by a plurality of banks, one bank is selected to function as a row-active bank by a word line and all the banks including the aforementioned one bank are selected by the column line 1o function as column-active banks.

In a multibank DRAM, the equalization of a given bit line pair is canceled by setting one word line from the logically low level (hereafter referred to as the "L level") to the logically high level (hereafter referred to as the "H level") concurrently with other word lines that are set from the L level to the H level. By canceling the equalization in this manner, the data stored in the memory cell corresponding to the one bit line pair are read out to the one bit line pair, and the data thus read out are amplified by a sense amplifier to source potentials VDD and VSS. However, since the equalization of the sub-data bus connected to the one bit line pair via a column switch is not yet cleared at this point, the data that have been amplified by the sense amplifier are held at the one bit line pair instead of being transferred to the sub-data bus.

Since the data that have been read out from the memory cells are amplified to the source potentials VDD and VSS and are held at the one bit line pair, a through current is generated between the one bit line pair and the sub-data bus which corresponds to the bit line pair, by the difference between the source potential VDD and the potential ½ VDD and the difference between the potential ½ VDD and the source potential VSS.

In order to solve this problem, the generation of a through current is prevented in a multibank DRAM in the prior art by providing a column decoder and a column line for each bank. However, this solution achieved by providing many column decoders results in an undesirably large circuit scale.

It is possible to prevent the generation of a through current by providing a common column decoder and a common column line to serve a plurality of banks and canceling the equalization of the sub-data bus at a row-active bank that does not match the column-active bank. However, since the data that are stored in the memory cells at non column-active banks are transferred to the sub-data bus, a problem of an increase in the power consumption results from this transfer operation.

SUMMARY OF THE INVENTION

An object of the present invention, which has been completed by addressing the problems of the prior art discussed above, is to provide a semiconductor memory that achieves a reduction in power consumption by preventing the generation of a through current between a bit line pair and the sub-data bus and also achieves a more compact chip.

In order to achieve the object described above, the present invention provides a semiconductor memory constituted of a plurality of banks having a plurality of memory cells. Each bank in the semiconductor memory is provided with a means for switching that connects a bit line pair to which the data stored in its memory cells are read out and a data bus. In addition, each means for switching is provided with a first gate portion that is controlled by a switching means selection signal assigned to individual means for switching and a second gate portion that is controlled by a common column decoder shared by a plurality of banks, with the first gate portion and the second gate portion connected in series to the bit line pair.

This structure makes it possible to electrically disconnect the bit line pair from the data bus with either the switching means selection signal or the column decoder. Namely, by using the switching means selection signal, the bit line pair and the data bus are connected with each other only at a specific bank to enable the execution of data transfer. Consequently, even in a circuit structure in which the column decoder is shared by a plurality of banks, no through current is generated between the bit line pair and the data bus at a bank where it is not necessary to transfer data, to result in a reduction in the power consumption.

It is desirable to constitute the first gate portion with a first transistor and a second transistor and to constitute the second gate portion with a third transistor and a fourth transistor. In addition, the switching means selection signal should be input to a control terminal of the first transistor and to the control terminal of the second transistor, and a column decoder output signal output by the column decoder should be input to the control terminal of the third transistor and the control terminal of the fourth transistor. Furthermore, a first terminal of the first transistor and a first terminal of the second transistor are connected to the bit line pair, a second terminal of the first transistor is connected to a first terminal of the third transistor, a second terminal of the second transistor is connected to a first terminal of the fourth transistor and a second terminal of the third transistor and a second terminal of the fourth transistor are connected to the data bus. By adopting such a structure, the electrical connection between the bit line pair and the data bus can be cut off in response to either the switching means selection signal or the column decoder through a simple circuit structure.

According to the present invention, a semiconductor memory constituted of a plurality of banks having a plurality of memory cells is provided. Each of the banks in the semiconductor memory is provided with a means for switching that connects a bit line pair to which the data stored in its memory cells are read out, a data bus and a means for sub-switching that controls the means for switching. In addition, the means for sub-switching is provided with a transfer gate which allows a column decoder output signal output by a column decoder shared by a plurality of banks to pass through to be supplied to the means for switching when a switching means selection signal assigned to the individual means for switching is at a given logic level and a transistor that supplies a specific potential to the means for switching when the switching means selection signal is at another logic level.

By adopting this structure, it is possible to electrically disconnect the bit line pair from the data bus with either the switching means selection signal or the column decoder output signal. Namely, by using the switching means selection signal, the bit line pair and the data bus are connected to each other only at a specific bank to enable the execution of data transfer. As a result, even in a circuit structure in which the column decoder is shared by a plurality of banks, no through current is generated between the bit line pair and the data bus at a bank where no data transfer is necessary, to result in a reduction in power consumption.

According to the present invention, a semiconductor memory constituted of a plurality of banks having a plurality of memory cells is provided. Each of the banks in the semiconductor memory is provided with a means for switching that connects a bit line pair to which the data stored in its memory cells are read out, a data bus and a means for sub-switching that controls the means for switching. In addition, the means for sub-switching is provided with a potential selection/supply portion that supplies either a specific potential or a potential of the switching means selection signal assigned to individual means for switching to a connection node that connects with the means for switching in response to a column decoder output signal output by a column decoder shared by a plurality of banks and a transistor that is capable of fixing the potential at the connection node at the specific level regardless of the state of the potential selection/supply portion.

By adopting this structure, it is possible to electrically disconnect the bit line pair from the data bus with either the switching means selection signal or the column decoder output signal. Namely, by using the switching means selection signal, the bit line pair and the data bus are connected only at a specific bank to enable the execution of data transfer. As a result, even in a circuit structure in which the column decoder is shared by a plurality of banks, no through current is generated between the bit line pair and the data bus at a bank where no data transfer is necessary to result in a reduction in power consumption. In addition, since the column decoder is indirectly connected to the means for switching via the means for sub-switching, the column decoder remains unaffected even when the number of memory cells at each bank increases resulting in an increase in the load on the means for switching. Thus, it is possible to activate the column decoder output signal within a short period of time to realize a fast semiconductor memory.

It is desirable to constitute the potential selection/supply portion with a P-channel transistor and an N-channel transistor. In addition, the drain of the P-channel transistor and the drain of the N-channel transistor should be connected to the connection node, with the switching means selection signal input to the source of the P-channel transistor and the specific potential supplied to the source of the N-channel transistor. By adopting this structure, the potential selection/supply portion can be constituted as a simple circuit.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments. In the drawings.

DETAILED DESCRIPTION OF THE PREFERRED EMBODIMENT

The following is a detailed explanation of preferred embodiments of the semiconductor memory according to the present invention, given in reference to the attached drawings. It is to be noted that in the following explanation, the same reference numbers are assigned to components having roughly identical functions and structural features to preclude the necessity for repeated explanation thereof.

Figure 1:
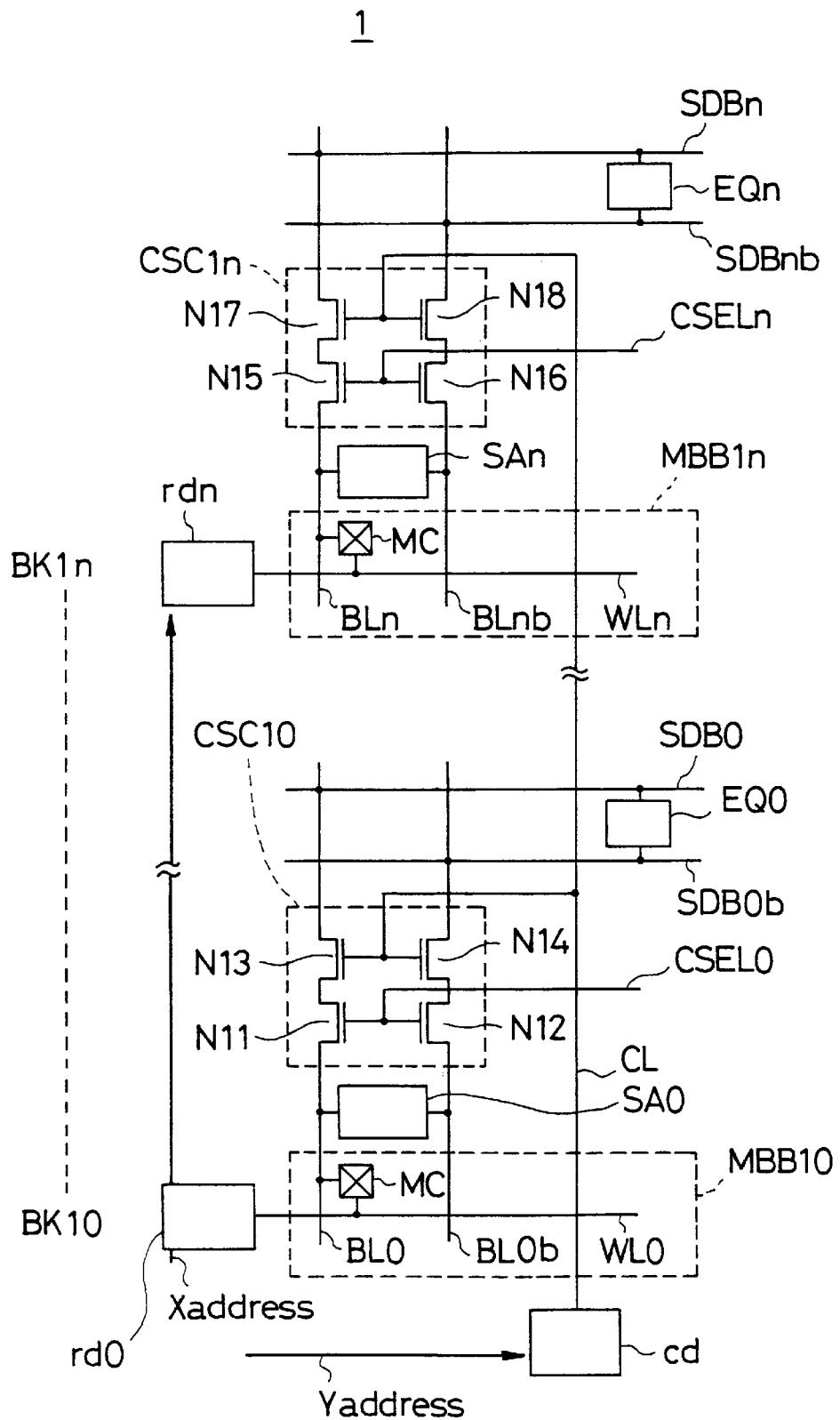
FIG. 1 is a circuit diagram illustrating the structure of the DRAM in a first embodiment of the present invention.

FIG. 1 illustrates the circuit structure of a DRAM 1 in the first embodiment of the present invention.

The DRAM 1 is provided with n+1 (n represents a natural number) banks BK10, . . . , BK1n.

The individual banks BK10, . . . , BK1n respectively comprise row decoders rd0, . . . , rdn selected by an X address signal Xaddress, word lines WL0, . . . , WLn selected by the row decoders rd0, . . . , rdn, memory cell bank blocks MBB10, . . . , MBB1n each provided with a memory cell MC, that are selected by the word lines WL0, . . . , WLn and a column line CL, column switching circuits, CSC10, . . . , CSC1n that control data transfer between sub-data buses SDB0/SDB0$b$, . . . , SDBn /SDBnb and bit line pairs BL0 /BL0$b$, . . . , BLn /BLnb respectively, equalization circuits EQ0, . . . , EQn that equalize the potentials at the sub-data buses SDB/SDB0$b$, . . . , SDBn /SDBnb at ½ of a source potential VDD (hereafter referred to as "potential ½ VDD") and sense amplifiers SA0, . . . , SAn that amplify data stored in the memory cells MC.

In addition, the DRAM 1 is provided with a column decoder cd shared by the individual banks BK10,..., BK1n, and the column decoder cd activates the column line CL in response to a Y address signal Yaddress.

Figure 6:
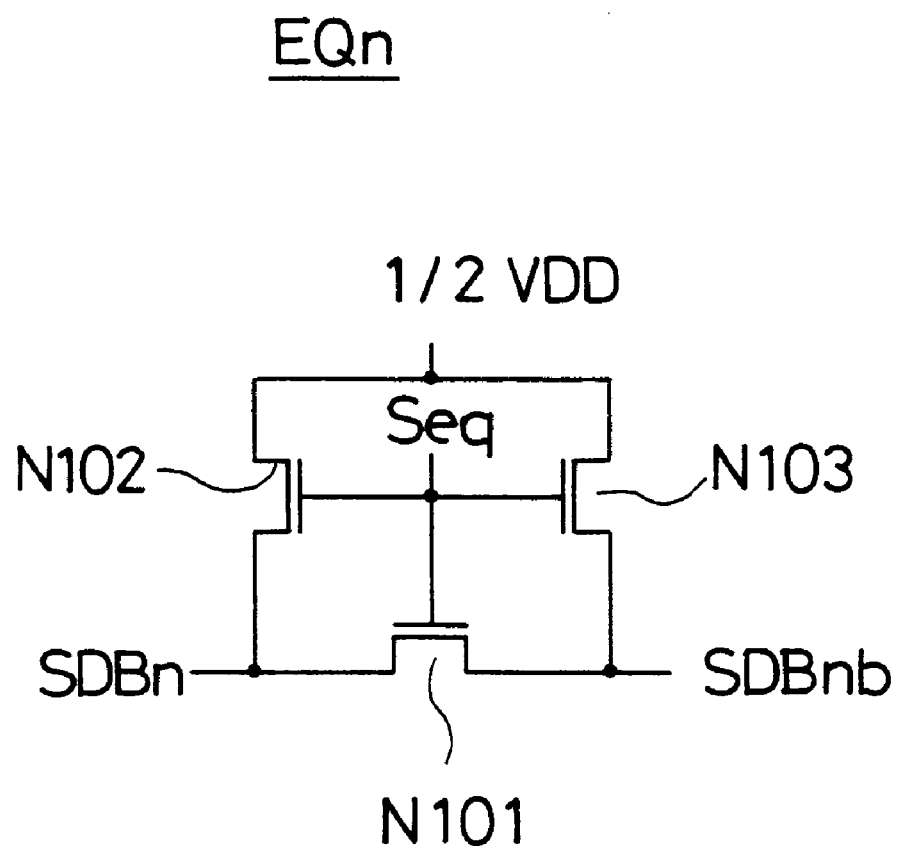
FIG. 6 is a circuit diagram illustrating the structure of the equalization circuit provided for the DRAMS shown in FIGS. 1, 3 and 4.

As illustrated in FIG. 6, each of the equalization circuits EQ0, . . . , EQn is constituted of 3 N-channel transistors (hereafter referred to as N transistors) N101, N102 and N103. The N transistors N101, N102 and N103 share a common gate through which an equalize signal Seq is input. In addition, the N transistor N103 and the N transistor N102 share a common drain to which a potential that is ½ of the source potential VDD is applied. The source of the N transistor N102 and the drain of the N transistor N101 are commonly connected to the sub-data bus SDBn, whereas the source of the N transistor N103 and the source of the N transistor N101 are commonly connected to the sub-data bus SDBnb.

Since the individual column switching circuits CSC10, . . . , CSC1n adopt circuit structures that are almost identical to one another, the column switching circuit CSC10 and the column switching circuit CSC1n are explained here as typical examples.

The column switching circuit CSC10 is constituted of four N transistors N11, N12, N13 and N14. The N transistor N11 and the N transistor N13 are connected in series to the bit line BL0, whereas the N transistor N12 and the N transistor N14 are connected in series to the bit line BL0$b$. The gate of the N transistor N11 and the gate of the N transistor N12 are connected to commonly receive a column switch selection signal CSEL0. In addition, the gate of the N transistor N13 and the gate of the N transistor N14 are commonly connected to the column line CL.

The column switching circuit CSC1n is constituted of four N transistors N15, N16, N17 and N18. The N transistor N15 and the N transistor N17 are connected in series to the bit line BLn, whereas the N transistor N16 and the N transistor N18 are connected in series to the bit line BLnb. The gate of the N transistor N15 and the gate of the N transistor N16 are connected to commonly receive a column switch selection signal CSELn. In addition, the gate of the N transistor N17 and the gate of the N transistor N18 are commonly connected to the column line CL.

Figure 2:
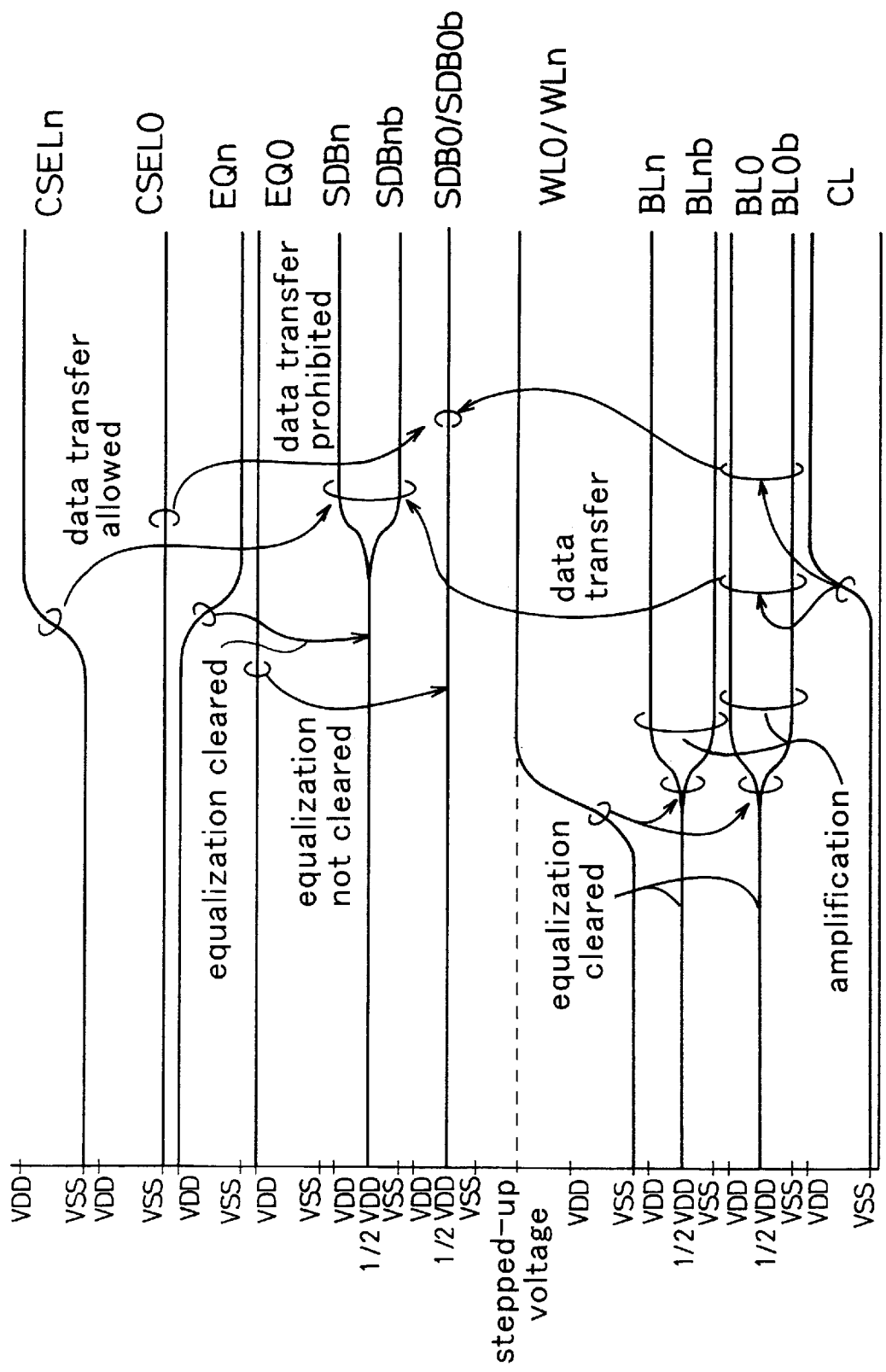
FIG. 2 is a timing chart of the operation achieved by the DRAM shown in FIG. 1.

The operation of the DRAM 1 in the first embodiment structured as described above is now explained in reference to FIG. 2.

When the banks BK10, . . . , BK1n provided at the DRAM 1 are in a non-operating state, the sub-data buses SDB0/SDB0b, . . . , SDBn /SDBnb, and the bit line pairs BL0/BL0b, . . . , BLn /BLnb are equalized to the potential ½ VDD.

Access to the memory cell MC provided at the bank BK1n starts by canceling the equalization of the bit line pair BLn /BLnb and setting the word line WLn from the L level to the H level. The data that have been stored in the memory cell MC are output to the bit line pair BLn /BLnb and are amplified by the sense amplifier SAn.

Next, the equalization of the sub-data buses SDBn/SDBnb achieved by the equalization circuit EQn is cleared. At this point, the data that have been amplified by the sense amplifier SAn are transferred to the sub-data buses SDBn/SDBnb by setting the column line CL from the L level to the H level in a multibank DRAM in the prior art.

The DRAM 1 in the first embodiment of the present invention operates in a manner almost identical to that in which the multibank DRAM in the prior art operates as long as it is in a non-operating state or in a row-active state. However, it operates in a manner that characterizes the present invention as described below in a column-active state.

In the column-active state, only the column switch selection signal that corresponds to the column-active bank among the column switch selection signals CSEL0, . . . , CSELn set to the L level is switched from the L level to the H level before the level at the column line CL shifts from the L level to the H level. It is to be noted that in the following explanation, the banks BK10 and BK1n are row-active banks and the bank BK1n is a column-active bank.

Next, the column switch selection signal CSELn is set to the H level to activate the N transistors N15 and N16 provided at the column switching circuit CSC1n. However, since the column switch selection signal CSEL0 sustains the L level, the N transistors N11 and N12 provided at the column switching circuit CSC10 remain in an inactive state. Thus, while the column switching circuit CSC1nprovided at the bank BK1n is activated, the column switching circuit CSC10 provided at the bank BK10 is not activated when the level at the column line CL shifts from the L level to the H level. Consequently, the bit line pair BLn/BLnb and the sub-data buses SDBn/SDBnb become connected via the column switching circuit CSC1n at the bank BK1n so that the data stored in the memory cell MC provided at the memory cell bank block MBB1n are transferred to the sub-data buses SDBn / SDBnb. However, at the bank BK10, the bit line pair BL0/BL0b and the sub-data buses SDB0/SDB0b are electrically disconnected from each other by the column switching circuit CSC10.

As explained above, the DRAM 1 in the first embodiment, in which the column decoder cd and the column line CL are shared by the plurality of banks BK10, . . . , BK1n, enables miniaturization of the chip. In addition, since the bit line pair and the sub-data buses are electrically disconnected at a bank where it is not necessary to perform data transfer, there is no data transfer at these banks, to reduce the power consumption.

Figure 3:
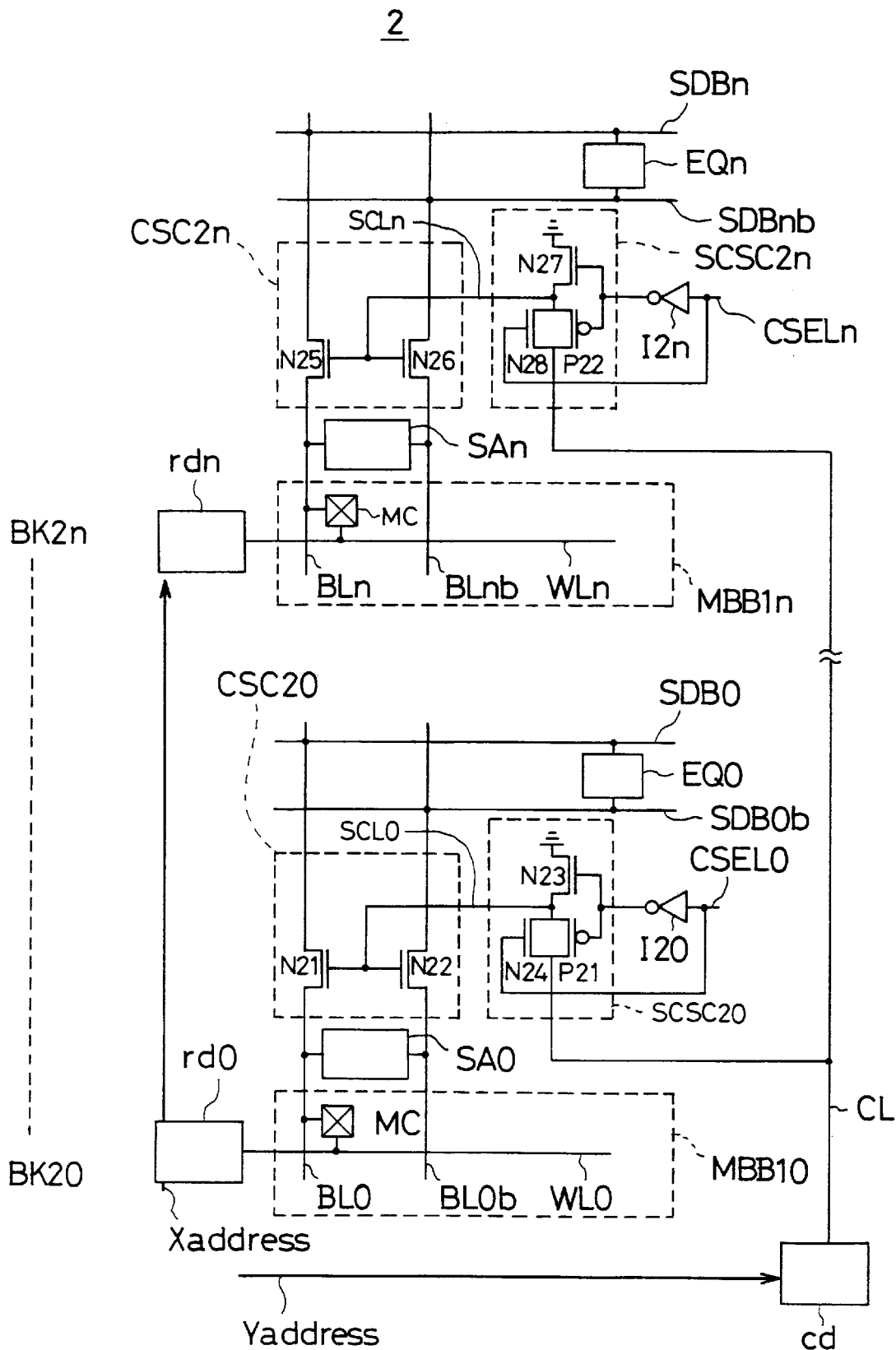
FIG. 3 is a circuit diagram illustrating the structure of the DRAM in a second embodiment of the present invention.

FIG. 3 shows the circuit structure of a DRAM 2 in the second embodiment of present invention. This DRAM 2 assumes a structure achieved by replacing the banks BK10, . . . , BK1n in the DRAM 1 in the first embodiment with banks BK20, . . . , BK2n respectively. The banks BK20, . . . , BK2n respectively assume structures achieved by replacing the column switching circuits CSC10, . . . , CSC1n at the banks BK10, . . . , BK1n with column switching circuits CSC20, . . . , CSC2n and by adding sub-column switching circuits SCSC20, . . . SCSC2n constitution means for sub-switching and inverters I20, . . . , I2n to the structures of the banks BK10, . . . , BK1n.

Since the individual column switching circuits CSC20, . . . , CSC2n adopt circuit structures that are almost identical to one another, the column switching circuit CSC20 and the column switching circuit CSC2n are explained here as typical examples.

The column switching circuit CSC20 is constituted of two N transistors N21 and N22. The N transistor N21 is connected in series to the bit line BL0, whereas the N transistor N22 is connected in series to the bit line BL0b. In addition, the gate of the N transistor N21 and the gate of the N transistor N22 are commonly connected to a sub-column line SCL0.

The column switching circuit CSC2n is constituted of two N transistors N25 and N26. The N transistor N25 is connected in series to the bit line BLn, whereas the N transistor N26 is connected in series to the bit line BLnb. In addition, the gate of the N transistor N25 and the gate of the N transistor N26 are commonly connected to a sub-column line SCLn.

Since the individual sub-column switching circuits SCSC20, . . . , SCSC2n adopt circuit structures that are almost identical to one another, the sub-column switching circuit SCSC20 and the sub-column switching circuit SCSC2n are explained here as typical examples.

The sub-column switching circuit SCSC20 is constituted of 2 N transistors N23 and N24 and a P-channel transistor (hereafter referred to as a "P transistor") P21. The drain of the P transistor P21 and the drain of the N transistor N23 are commonly connected to the sub-column line SCL0. The source of the P transistor P21 is connected to the column line CL, whereas the source of the N transistor N23 is connected to the ground. In addition, the gate of the P transistor P21 and the gate of the N transistor N23 are commonly connected to the output terminal of the inverter I20. The source and the drain of the N transistor N24 are respectively connected to the drain and the source of the P transistor P21. The gate of the N transistor N24 and the input terminal of the inverter I20 are connected to commonly receive the column switch selection signal CSEL0.

The sub-column switching circuit SCSC2n is constituted of two N transistors N27 and N28 and a P transistor P22. The drain of the P transistor P22 and the drain of the N transistor N27 are commonly connected to the sub-column line SCLn. The source of the P transistor P22 is connected to the column line CL, whereas the source of the N transistor N27 is connected to the ground. In addition, the gate of the P transistor P22 and the gate of the N transistor N27 are commonly connected to the output terminal of the inverter I2n. The source and the drain of the N transistor N28 are respectively connected to the drain and the source of the P transistor P22 so that a transfer gate is constituted by the N transistor N28 and the P transistor P22. The gate of the N transistor N28 and the input terminal of the inverter I2n are connected to commonly receive the column switch selection signal CSELn.

Now, the operation of the DRAM 2 in the second embodiment structured as described above is explained in reference to FIG. 2.

As long as the DRAM 2 is in a non-operating state or in a row-active state, it operates in a manner almost identical to that in which a multibank DRAM in the prior art operates. However, it engages in the operation described below in a column-active state that characterizes the present invention.

In the column-active state, before the level at the column line CL shifts from the L level to the H level, only the column switch selection signal corresponding to the column-active bank among the column switch selection signals CSEL0, . . . , CSELn set to the L level is switched from the L level to the H level. It is to be noted that in the explanation below, the banks BK20 and the BK2n are row-active banks and the bank BK2n is a column-active bank.

Next, the column switch selection signal CSELn is set to the H level to activate the P transistor P22 and the N transistor N28 provided at the sub-column switching circuit SCSC2n while the N transistor N27 is set in an inactive state.

As the level at the column line CL shifts from the L level to the H level, the N transistor N28 and the P transistor P22 set the sub-column line SCLn to the H level and, as a result, the N transistors N25 and N26 provided at the column switching circuit CSC2n become activated.

In this circuit structure, the N transistor N28 supplies a potential at the L level to the gates of the N transistors N25 and N26 when the column line CL is at the L level, and the P transistor P22 supplies a potential at the H level to the gates of the N transistors N25 and N26 when the column line CL is at the H level. By providing the N transistor N28 and the P transistor P22 fulfilling such functions, it is possible to supply the potential generated at the column line CL to the gates of the N transistors N25 and N26 at full level.

With the N transistors N25 and N26 provided at the column switching circuit CSC2n activated, the bit line pair BLn/BLnb and the sub-data buses SDBn/SDBnb become connected via the column switching circuit CSC2n so that the data stored in the memory cells MC provided at the memory cell bank block MBB1n are transferred to the sub-data buses SDBn/SDBnb.

At the same time, since the column switch selection signal CSEL0 sustains the L level, the P transistor P21 and the N transistor N24 provided at the sub-column switching circuit SCSC20 are set in an inactive state while the N transistor N23 is set in an active state. Thus, the N transistors N21 and N22 provided at the column switching circuit CSC20 sustain an inactive state regardless of the potential level at the column line CL. Consequently, the bit line pair BL0/BL0b are electrically disconnected from the sub-data buses SDB0/SDB0b by the column switching circuit CSC20, disabling the transfer of the data stored in the memory cells provided at the memory cell bank block MBB1n to the sub-data buses SDBn/SDBnb.

As explained above, in the DRAM 2 in the second embodiment, in which the equalized sub-data buses and the bit line pair that is set in a standby state after data amplification are electrically disconnected from each other by the sub-column switching circuit and the column switching circuit which are operated with the column switch selection signal, the generation of a through current is prevented and a reduction in power consumption is achieved.

Figure 4:
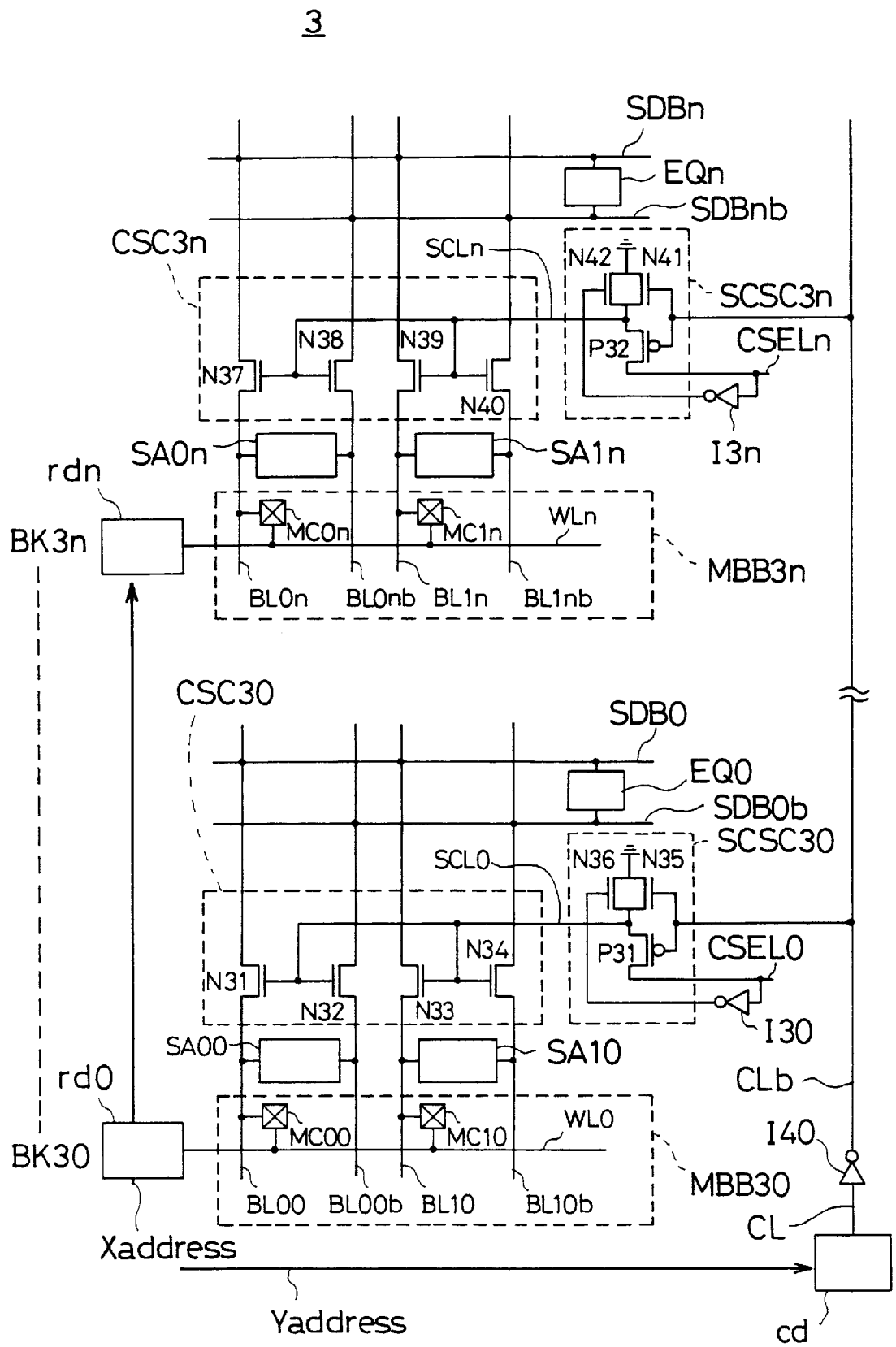
FIG. 4 is a circuit diagram illustrating the structure of the DRAM in a third embodiment of the present invention.

FIG. 4 illustrates the circuit structure of a DRAM 3 in the third embodiment of the present invention. This DRAM 3 assumes a structure achieved by replacing the banks BK10, . . . , BK1n in the DRAM 1 in the first embodiment with banks BK30, . . . , BK3n respectively. In addition, the individual banks BK30, . . . , BK3n respectively assume structures by replacing the column switching circuits CSC10, . . . , CSC1n at the banks BK10, . . . , BK1n with column switching circuits CSC30, . . . , CSC3n, by replacing the memory cell bank blocks MBB10, . . . , MBB1n with memory cell bank blocks MBB30, . . . , MBB3n and by adding sub-column switching circuits SCSC30, . . . , SCSC3n and inverters I30, . . . , I3n to the structures of the banks BK10, . . . , BK1n. Moreover, the banks BK30, . . . , BK3n are each provided with two sense amplifiers, i.e., sense amplifier SA00/SA10, . . . , SA0n/SA1n respectively. In the DRAM 3 in the third embodiment, an inverter I40, which is shared. by all the banks BK30, . . . , BK3n is provided.

Since the individual column switching circuits CSC30, . . . , CSC3n assume circuit structures that are almost identical to one another, an explanation is given here on the column switching circuits CSC30 and CSC3n as typical examples.

The column switching circuit CSC30 is constituted of four N transistors N31, N32, N33 and N34. The N transistor N31 is connected in series to a bit line BL00, the N transistor N32 is connected in series to a bit line BL00b, the N transistor N33 is connected in series to a bit line BL10 and the N transistor N34 is connected in series to a bit line BL10b. In addition, the gates of the N transistors N31, N32, N33 and N34 are commonly connected to the sub-column line SCL0.

The column switching circuit CSC3n is constituted of four N transistors N37, N38, N39 and N40. The N transistor N37 is connected in series to a bit line BL0n, the N transistor N38 is connected in series to a bit line BL0nb, the N transistor N39 is connected in series to a bit line BL1n and the N transistor N40 is connected in series to a bit line BL1nb. In addition, the gates of the N transistors N37, N38, N39 and N40 are commonly connected to the sub-column line SCLn.

Since the individual sub-column switching circuits SCSC30, . . . , SCSC3n assume circuit structures that are almost identical to one another, an explanation is given here on the column switching circuit SCSC30 and SCSC3n as typical examples.

The sub-column switching circuit SCSC30 is constituted of two N transistors N35 and N36 and a P transistor P31. The drain of the P transistor P31 and the drain of the N transistor N35 are commonly connected to the sub-column line SCL0. The source of the P transistor P31 and an input terminal of the inverter I30 are connected to commonly receive the column switch selection signal CSEL0. The source of the N transistor N35 is connected to the ground. In addition, the gate of the P transistor P31 and the gate of the N transistor N35 are commonly connected to an output terminal of the inverter I40. The source and the drain of the N transistor N36 are respectively connected to the source and the drain of the N transistor N35, and the gate of the N transistor N36 is connected to an output terminal of the inverter I30.

The sub-column switching circuit SCSC3n is constituted of two N transistors N41 and N42 and a P transistor P32. The drain of the P transistor P32 and the drain of the N transistor N41 are commonly connected to the sub-column line SCLn. The source of the P transistor P32 and an input terminal of the inverter I3n are connected to commonly receive the column switch selection signal CSELn. The source of the N transistor N41 is connected to the ground. In addition, the gate of the P transistor P32 and the gate of the N transistor N41 are commonly connected to the output terminal of the inverter I40. By adopting this structure, the P transistor P32 and the N transistor N41 are made to function as a potential selection/supply portion that selects either the ground potential or the potential of the column switch selection signal CSELn and supplies the selected potential to the sub-column line SCLn. Moreover, the source and the drain of the N transistor N42 are respectively connected to the source and the drain of the N transistor N41, and the gate of the N transistor N42 is connected to an output terminal of the inverter I3n.

Since the individual memory cell bank blocks MBB30, . . . , MBB3n assume circuit structures that are almost identical to one another, an explanation is given here on the memory cell bank blocks MBB30 and MBB3n as typical examples.

The memory cell bank block MBB30 is provided with two memory cells MC00 and MC10. The memory cell MC00n is connected to the bit line BL00 and the word line WL0, whereas the memory cell MC10 is connected to the bit line BL10 and the word line WL0.

The memory cell bank block MBB3n is provided with two memory cells MC0n and MC1n. The memory cell MC0n is connected to the bit line BL0n and the word line WLn, whereas the memory cell MC1n is connected to the bit line BL1n and the word line WLn.

Figure 5:
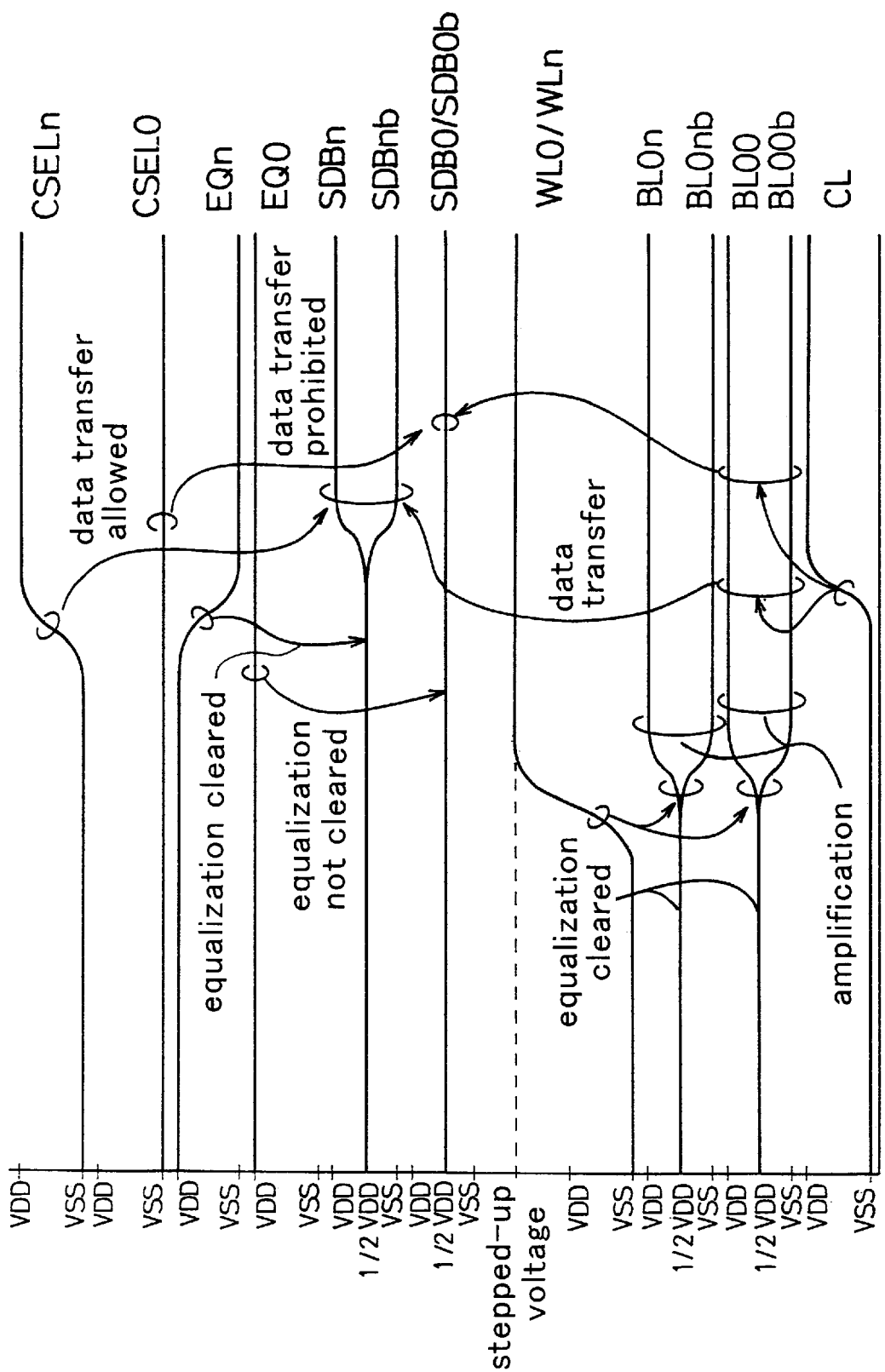
FIG. 5 is a timing chart of the operation achieved by the DRAM shown in FIG. 4.

Now, the operation of the DRAM 3 in the third embodiment structured as described above is explained in reference to FIG. 5.

As long as the DRAM 3 is in a non-operating state or in a row-active state, it operates in a manner almost identical to that in which a multibank DRAM in the prior art operates. However, it engages in the operation described below in a column-active state that characterizes the present invention.

In the column-active state, before the level at the column line CL shifts from the L level to the H level, only the column switch selection signal corresponding to the column-active bank among the column switch selection signals CSEL0, . . . , CSELn set to the L level is switched from the L level to the H level. It is to be noted that in the explanation below, the banks BK30 and BK3n are row-active banks and the bank BK3n is a column-active bank.

Next, the column switch selection signal CSELn is set to the H level to set the N transistor N42 provided at the sub-column switching circuit SCSC3n in an inactive state. In addition, the source of the P transistor P32 is set to the H level. At the same time, since the column switch selection signal CSEL0 sustains the L level, the N transistor N36 provided at the sub-column switching circuit SCSC30 is set in an active state. In addition, the source of the P transistor P31 is set to the L level.

As the level at the column line CL shifts from the L level to the H level, the inverter I40 sets column line CLb from the H level to the L level. With the column line CLb set to the L level, the P transistor P32 provided at the sub-column switching circuit SCSC3n is activated while the N transistor N41 is set in an inactive state. Likewise, the P transistor P31 provided at the sub-column switching circuit SCSC30 is activated while the N transistor N35 is set in an inactive state.

As explained above, with the P transistor P32 set in an active state, the N transistors N41 and N42 set in an inactive state and the source of the P transistor P32 set to the H level at the sub-column switching circuit SCSC3n, the sub-column line SCLn is set to the H level. As a result, the N transistors N37, N38, N39 and N40 provided at the column switching circuit CSC3n are activated.

When the N transistors N37 and N38 provided at the column switching circuit CSC3n are activated, the bit line pair BL0n/BL0nb and the sub-data buses SDBn/SDBnb become connected via the column switching circuit CSC3n. This enables the transfer of the data stored in the memory cell MC0n provided at the memory cell bank block MBB3n to the sub-data buses SDBn/SDBnb. Likewise, when the N transistors N39 and N40 provided at the column switching circuit CSC3n are activated, the bit line pair BL1n/BL1nb and the sub-data buses SDBn/SDBnb become connected via the column switching circuit CSC3n. This enables transfer of the data stored in the memory cell MC1n provided at the memory cell bank block MBB3n to the sub-data buses SDBn/SDBnb.

At the same time, with the P transistor P31 and the N transistor N36 set in an active state, the N transistor N35 set in an inactive state and the source of the P transistor P31 set to the L level at the sub-column switching circuit SCSC30, the sub-column line SCL0 is set to the L level. Thus, the N transistors N31, N32, N33 and N34 provided at the column switching circuit CSC30 sustain an inactive state. As a result, the data stored in the memory cells MC00 and MC10 provided at the memory cell bank block MBB30 are not transferred to the sub-data buses SDB0/SDB0b.

As explained above, in the DRAM 3 in the third embodiment, in which the equalized sub-data buses and the bit line pair that is set in a standby state after data amplification are electrically disconnected from each other by the sub-column switching circuit and the column switching circuit which are operated with the column switch selection signal, the generation of a through current is prevented and a reduction in power consumption is achieved, as in the case of the DRAM's 1 and 2 in the first and second embodiments.

In addition, in the DRAM 3 in the third embodiment, the column line CLb is connected to the column switching circuits CSC30, . . . , CSC3n provided at the banks BK30, . . . , BK3n respectively via the sub-column switching circuits SCSC30, . . . , SCSC3n. Even when a plurality of means for switching each constituted of two N transistors N31/N32, N33/N34 or the like are provided at each of the column switching circuits CSC30, . . . , CSC3n, as illustrated in FIG. 4, the load that is connected to the column line CL is prevented from increasing. As a result, it is possible to activate/deactivate the column line CL within a short period of time to ultimately achieve high speed operation of the DRAM 3.

While the invention has been particularly shown and described with respect to preferred embodiments thereof by referring to the attached drawings, the present invention is not limited to these examples and it will be understood by those skilled in the art that various changes in form and detail may be made therein without departing from the spirit, scope and teaching of the invention.

As has been explained, in the semiconductor memory according to the present invention, the generation of a through current is prevented from occurring between the bit line pair and the data buses at a bank where it is not necessary to perform data transfer, while keeping down the chip size. Thus, energy saving is achieved.

The entire disclosure of Japanese Patent Application No. 10-370975 filed on Dec. 25, 1998 including specification, claims, drawings and summary is incorporated herein by reference in its entirety.

What is claimed is:

1. A semiconductor memory device comprising:

a plurality of bit line pairs;

a plurality of data transfer line pairs;

a plurality of banks each having a plurality of memory cells, each of the memory cells connected to a corresponding one of the bit line pairs;

a plurality of gate circuits, each connected between a corresponding one of the bit line pairs and a corresponding one of the data transfer line pairs, each of said gate circuits having a first gate portion activated responsive to a corresponding one of a plurality of selecting signals and a second gate portion activated responsive to a decoding signal, wherein the corresponding bit line pair is electrically connected to the corresponding data transfer line pair when both the first and second gate portions are activated; and a decoding circuit that outputs the decoding signal to the second gate portions.

2. The semiconductor memory device according to claim 1, wherein the first gate portions each include a first transistor and a second transistor and the second gate portions each include a third transistor and a fourth transistor, respective ones of the selecting signals are input to control terminals of the first transistors and control terminals of the second transistors and the decoding signal output by said decoding circuit is input to control terminals of the third transistors and control terminals of the fourth transistors, first terminals of the first transistors and first terminals of the second transistors are connected to corresponding bit line pairs and second terminals of the first transistors are connected to first terminals of the third transistors, and second terminals of the second transistors are connected to first terminals of the fourth transistors, and second terminals of the third transistors and second terminals of the fourth transistors are connected to corresponding data transfer line pairs.

3. The semiconductor memory device according to claim 2, wherein the first transistors, the second transistors, the third transistors and the fourth transistors are each N-channel transistors.

4. The semiconductor memory device according to claim 1, further comprising precharge circuits connected to corresponding data transfer line pairs to precharge the data transfer line pairs to voltage levels equal to each other.

5. The semiconductor memory device according to claim 1, wherein the device is a multibank DRAM.

6. A semiconductor memory device comprising:

a plurality of bit line pairs;

a plurality of data transfer line pairs;

a plurality of banks each having a plurality of memory cells, each of the memory cells connected to a corresponding one of the bit line pairs;

a plurality of first gates, each connected between a corresponding one of the bit line pairs and a corresponding one of the data transfer line pairs, each of said first gates being activated responsive to a decoding signal;

a plurality of second gates each connected to a corresponding one of said first gates, each of said second gates controlling transfer of the decoding signal to a corresponding first gate responsive to a corresponding one of a plurality of selecting signals; and a decoding circuit that outputs the decoding signal to said plurality of second gates.

7. The semiconductor memory device according to claim 6, wherein said first gates each include a first transistor and a second transistor and control terminals of the first transistors and control terminals of the second transistors are connected to the corresponding second gates, first terminals of the first transistors and first terminals of the second transistors are connected to corresponding bit line pairs, and second terminals of the first transistors and second terminals of the second transistors are connected to corresponding data transfer line pairs.

8. The semiconductor memory device according to claim 7, wherein the first transistors and the second transistors are N-channel transistors, and the second gates output ground potential to the corresponding first gates responsive to non-receipt of the corresponding selecting signals.

9. The semiconductor memory device according to claim 6, further comprising precharge circuits connected to corresponding data transfer line pairs to precharge the data transfer line pairs to voltage levels equal to each other.

10. The semiconductor memory device according to claim 6, wherein the device is a multibank DRAM.

11. A semiconductor memory device comprising:

a plurality of bit line pairs;

a plurality of data transfer line pairs;

a plurality of banks each having a plurality of memory cells, each of the memory cells connected to a corresponding one of the bit line pairs;

a plurality of first gates, each connected between a corresponding one of the bit line pairs and a corresponding one of the data transfer line pairs, each of said first gates being activated responsive to a corresponding activating signal;

a plurality of second gates each connected to a corresponding one of said first gates, each of said second gates controlling transfer of a corresponding activating signal to a corresponding first gate responsive to a decoding signal, the activating signals having voltage levels of corresponding ones of a plurality of selecting signals; and a decoding circuit that outputs the decoding signal to said plurality of second gates.

12. The semiconductor memory device according to claim 11, wherein the second gates each include a P-channel transistor and an N-channel transistor, drains of the P-channel transistors and drains of the N-channel transistors being connected to corresponding first gates to provide the corresponding activating signals, the decoding signal being input to gates of the P-channel transistors and gates of the N-channel transistors, corresponding selection signals are input to sources of the P-channel transistors and a specific potential is supplied to sources of the N-channel transistors.

13. The semiconductor memory device according to claim 12, wherein the second gates each further include an additional N-channel transistor, drains of the additional N-channel transistors being connected to drains of the corresponding P-channel transistors and drains of the corresponding N-channel transistors, the specific potential and corresponding selection signals that are logic-inverted being respectively coupled to sources and gates of the additional N-channel transistors.

14. The semiconductor memory device according to claim 11, wherein the first gates each include a plurality of first transistors and a plurality of second transistors, a pair of each being provided for one of the bit line pairs, control terminals of the first transistors and control terminals of the second transistors being commonly connected to corresponding second gates, first terminals of the first transistors and first terminals of the second transistors are connected to corresponding bit line pairs and second terminals of the first transistors and second terminals of the second transistors are commonly connected to corresponding data transfer line pairs.

15. The semiconductor memory device according to claim 14, wherein the first transistors and the second transistors are N-channel transistors, and the second gates output ground potential to the corresponding first gates responsive to non-receipt of corresponding selecting signals.

16. The semiconductor memory device according to claim 11, further comprising precharge circuits connected to corresponding data transfer line pairs to precharge the data transfer line pairs to voltage levels equal to each other.

17. The semiconductor memory device according to claim 11, wherein the device is a multibank DRAM.

\* \* \* \* \*